United States Patent
Nishimura et al.

(10) Patent No.: US 9,036,359 B2
(45) Date of Patent: May 19, 2015

(54) COMPONENT BUILT-IN MODULE, ELECTRONIC DEVICE INCLUDING SAME, AND METHOD FOR MANUFACTURING COMPONENT BUILT-IN MODULE

(75) Inventors: Nozomu Nishimura, Tokyo (JP); Nobuhiro Mikami, Tokyo (JP)

(73) Assignee: LEONOVO INNOVATIONS LIMITED (HONG KONG), Quarry Bay (HK)

( * ) Notice: Subject to any disclaimer, the term of this patent is extended or adjusted under 35 U.S.C. 154(b) by 87 days.

(21) Appl. No.: 13/824,805

(22) PCT Filed: Jul. 19, 2011

(86) PCT No.: PCT/JP2011/066379
§ 371 (c)(1),
(2), (4) Date: Mar. 18, 2013

(87) PCT Pub. No.: WO2012/049898
PCT Pub. Date: Apr. 19, 2012

(65) Prior Publication Data
US 2013/0176746 A1    Jul. 11, 2013

(30) Foreign Application Priority Data

Oct. 15, 2010 (JP) .................. 2010-232320

(51) Int. Cl.
*H05K 1/00* (2006.01)
*H05K 1/18* (2006.01)
*H05K 3/28* (2006.01)
*F21V 21/00* (2006.01)
*H05K 3/44* (2006.01)

(52) U.S. Cl.
CPC ........... *H05K 1/186* (2013.01); *Y10T 29/49146* (2015.01); *H05K 1/189* (2013.01);

(Continued)

(58) Field of Classification Search
CPC ........ F21V 21/00; H05K 1/186; H05K 1/189; H05K 2201/2009; H05K 2203/1316; H05K 2203/1327; H05K 3/284; H05K 3/44
USPC .......... 361/760, 763, 767, 792, 751; 174/256, 174/257, 258, 259, 268
See application file for complete search history.

(56) References Cited

U.S. PATENT DOCUMENTS 8,488,330 B2 * 7/2013 Takai ............................ 361/760
8,630,096 B2 * 1/2014 Kim et al. ..................... 361/749

(Continued)

FOREIGN PATENT DOCUMENTS

JP    S54012459 A    1/1979
JP    H06350231 A    12/1994

(Continued)

OTHER PUBLICATIONS

The international search report for PCT/JP2011/066379 mailed on Aug. 16, 2011.

*Primary Examiner* — Yuriy Semenenko

(57) ABSTRACT

A component built-in module of the present invention includes: a flexible substrate that includes a first surface and a second surface on an opposite side of the first surface, the first surface including a concave part recessed in a direction from the first surface toward the second surface; a plurality of electronic components that are mounted on the first surface, mounting heights of the electronic components from the first surface to respective upper surfaces of the electronic components differing from each other; and a resin that seals the first surface. Among the plurality of electronic components, at least an electronic component having a highest mounting height is mounted in the concave part.

17 Claims, 18 Drawing Sheets

(52) U.S. Cl.
CPC ....... *H05K 3/284* (2013.01); *H05K 2201/2009* (2013.01); *H05K 2203/1316* (2013.01); *F21V 21/00* (2013.01); *H05K 3/44* (2013.01); *H05K 2203/1327* (2013.01)

(56) References Cited

U.S. PATENT DOCUMENTS

2006/0018098 A1* 1/2006 Hill et al. ................... 361/708
2006/0042827 A1* 3/2006 Chou et al. ................. 174/255
2013/0242565 A1* 9/2013 Arai et al. ................ 362/296.04

FOREIGN PATENT DOCUMENTS

| JP | H10065285 | A | | 3/1998 |
| JP | 2000004075 | A | | 1/2000 |
| JP | 2001177224 | | * | 6/2001 |
| JP | 2001177224 | A | | 6/2001 |
| JP | 2003037861 | A | | 2/2003 |
| JP | 2005228782 | A | | 8/2005 |

* cited by examiner

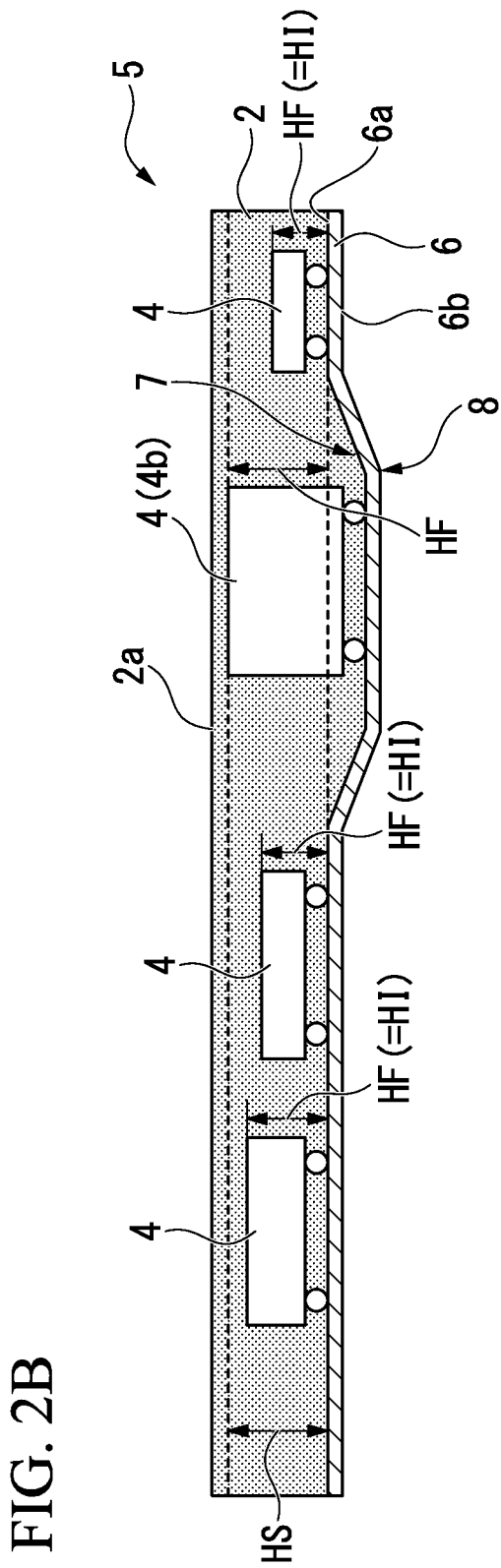

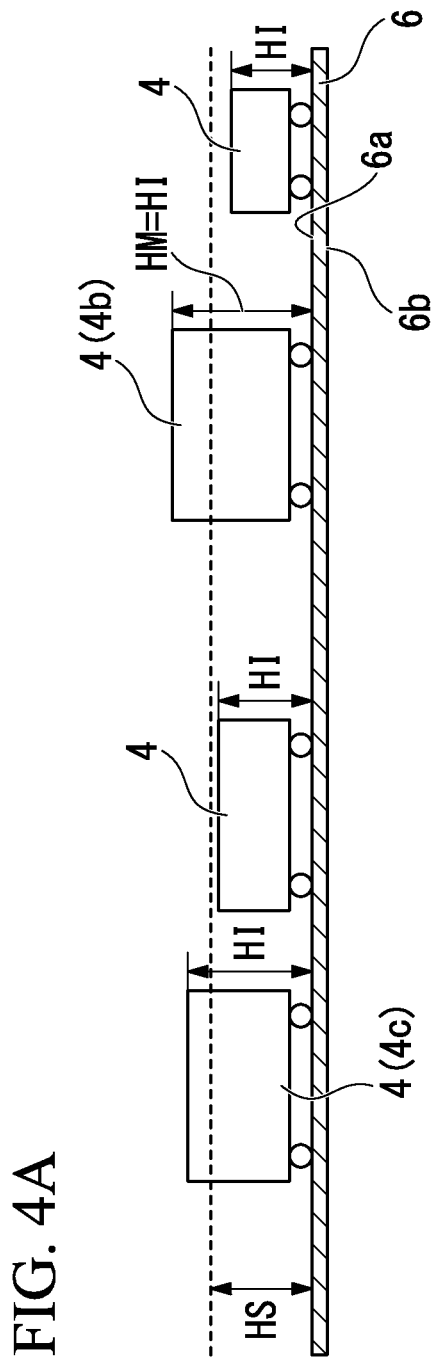

COMPONENT BUILT-IN MODULE, ELECTRONIC DEVICE INCLUDING SAME, AND METHOD FOR MANUFACTURING COMPONENT BUILT-IN MODULE

This application is a National Stage Entry of PCT/JP2011/066379 filed Jul. 19, 2011, which claims priority from Japanese Patent Application 2010-232320 filed Oct. 15, 2010, the contents of all of which are incorporated herein by reference, in their entirety.

TECHNICAL FIELD

The present invention relates to a component built-in module in which a flexible substrate on which a plurality of electronic components are mounted is sealed with a resin, an electronic device including it, and a method for manufacturing a component built-in module.

BACKGROUND ART

An electronic device such as a mobile phone includes a casing including an upper casing and a lower casing made of a synthetic resin, a plurality of component built-in modules that each have a plurality of electronic components mounted thereon and that are housed in the casing, a display and a battery.

On the other hand, in recent years, demand has been increasing for smaller and thinner electronic devices to greet the full-fledged arrival of a ubiquitous network society. In a structure that houses constituent components such as component built-in modules, a display, a battery and the like within a casing that is prepared in advance such as a mobile phone, the realization of further reductions in thickness is becoming difficult.

In contrast to this, Patent Document 1 discloses a constitution in which a component built-in module including an electronic component mounted on a wiring substrate is built into at least a part of the resin casing that includes an upper casing and a lower casing and sealed. In this Patent Document 1, by having at least one of the plurality of component built-in modules built into the resin casing, it is possible to cut down the space within the casing, and thereby enable a further reduction in thickness.

Patent Document 2 discloses a means of reducing the thinness of a printed wiring board on which are mounted electronic components of differing heights. As this means, Patent Document 2 discloses a structure (component built-in module) in which protrusions and recessions or curved surfaces are provided on a printed wiring board so that the heights of the plurality of electronic components mounted on the printed wiring board are the same on both surfaces.

Patent Document 3 discloses an in-molded item incorporating an electronic component (component built-in module) that is formed by in-mold integral molding an electronic component in a long fiber reinforced resin layer. Also, in this Patent Document 3, by making the coefficient of linear expansion of the inner layer part in the long fiber reinforced resin layer less than the coefficient of linear expansion of the surface layer part, a surface with few irregularities and with excellent planar smoothness is formed.

Patent Document 4 discloses a structure that houses an electronic component in an electronic component housing recess that is provided in a flexible substrate, and fills a sealing resin in this recess.

PRIOR ART DOCUMENTS

Patent Documents

[Patent Document 1] Japanese Unexamined Patent Application, First Publication No. 2003-37861
[Patent Document 2] Japanese Unexamined Patent Application, First Publication No. H10-65285
[Patent Document 3] Japanese Unexamined Patent Application, First Publication No. H06-350231
[Patent Document 4] Japanese Unexamined Patent Application, First Publication No. 2005-228782

SUMMARY OF THE INVENTION

Means for Solving the Problem

However, in the structure disclosed in Patent Document 1, the thickness of the resin casing (resin 2) that has built in a component built-in module 1 is determined on the basis of the thickness of the thickest electronic component 4, among the plurality of electronic components 4 to be mounted on the wiring substrate 3. For this reason, as shown in FIG. 20A, even with only one thick electronic component 4, the thickness of the casing (component built-in module 1 and resin (resin layer) 2) becomes increased.

On the other hand, in the case of the resin thickness on the electronic components 4 being made uniform, as shown in FIG. 20B, unevenness is formed in accordance with the heights of the electronic components 4 on the surface 2a of the resin 2. In this constitution, since problems arise concerning the design of the electronic device, it is necessary to make the surface (resin surface) 2a into a shape that corresponds to the casing surface (flat or the like). For example, in the case of fashioning the resin surface 2a to be flat, there has been the problem of the need to form the resin layer 2 by imparting a certain thickness from the upper surface 4a of the electronic components 4.

For this reason, in order to use the component built-in module 1 as a casing for an electronic device such as a mobile phone (in order to realize a reduction in thickness of the electronic device), a means has been strongly desired to make the resin layer 2 have a thin wall structure while making the surface 4a into a shape that conforms to the casing surface, such as flat, in addition to achieving a reduction in the thickness of the electronic device itself (improving the space efficiency obtained by embedding components in the casing).

In addition, it has been desired that it be a means that can be applied even to a mass-produced product such as a mobile phone (a means that enables easy and low-cost production).

The present invention has been achieved in view of the above circumstances. One example of the object of the present invention is to provide a component built-in module that can achieve a thinner wall of the resin layer while making the surface conform to the casing surface of an electronic device such as flat, and enable a further reduction in thinness, an electronic device including it, and a method for manufacturing a component built-in module.

Means for Solving the Problem

In order to achieve the aforementioned object, this invention provides the following means.

A component built-in module of the present invention includes: a flexible substrate that includes a first surface and a second surface on an opposite side of the first surface, the first surface including a concave part recessed in a direction from the first surface toward the second surface; a plurality of electronic components that are mounted on the first surface, mounting heights of the electronic components from the first surface to respective upper surfaces of the electronic components differing from each other; and a resin that seals the first surface. Among the plurality of electronic components, at least an electronic component having a highest mounting height is mounted in the concave part.

In the component built-in module of the present invention, when the mounting height of the electronic component having the highest mounting height is denoted as HM, a standard height from a flat part of the first surface is denoted as HS, the respective mounting heights of the plurality of electronic components are denoted as HI, and heights of all of the plurality of electronic components from the flat part of the first surface to respective upper surfaces of the electronic components are denoted as HF, the standard height HS may set so that a relation HM>HS is true. The concave part may be formed so that a relation HF≤HS is true. An electronic component having the mounting height HI in which a relation HI>HS is true may be mounted in the concave part.

In the component built-in module of the present invention, the standard height HS may be set so as to be the same height as the mounting height of an electronic component having a second highest mounting height, among the plurality of the electronic components.

In the component built-in module of the present invention, the standard height HS may be set so as to be the same height as an average value of the mounting heights of the plurality of the electronic components.

In the component built-in module of the present invention, the standard height HS may be set so as to be the same height as the mounting height of electronic components having the same mounting height whose number mounted on the first surface is most numerous, among the plurality of electronic components.

In the component built-in module of the present invention, an entire surface of the first surface may be sealed with resin.

In the component built-in module of the present invention, a distance between an upper surface of an electronic component having a shortest distance from a surface of the resin to the upper surface of the electronic component and the surface of the resin, may be 0.2 mm or more.

The component built-in module of the present invention may further include: an exfoliation preventing member which prevents exfoliation of the resin provided at an edge of at least one side of the first surface.

In the component built-in module of the present invention, the electronic component may double as an exfoliation preventing member.

In the component built-in module of the present invention, the flexible substrate may further include a hole part penetrating from the first surface to the second surface.

In the component built-in module of the present invention, the second surface may include a convex part formed by the concave part, and the component built-in module may further include a reinforcing member that is provided on the convex part.

In the component built-in module of the present invention, the second surface may include a convex part formed by the concave part, and the component built-in module may further include a reinforcing member that is provided in a vicinity of the convex part.

In the component built-in module of the present invention, the concave part may be a cross-sectional trapezoidal shape that has a slope part, and a slope angle of the slope part may be 60° or less with respect to a flat part of the first surface.

In the component built-in module of the present invention, the concave part may be formed by injection molding.

In the component built-in module of the present invention, the plurality of electronic components may include an LED.

An electronic device of the present invention includes the aforementioned component built-in module.

In the electronic device of the present invention, the resin of the component built-in module may constitute at least a part of a casing of the electronic device.

A method of the present invention for manufacturing a component built-in module including a flexible substrate that includes a first surface and a second surface on an opposite side of the first surface, includes the steps of: mounting a plurality of electronic components on the first surface; forming a concave part in which among the plurality of electronic components, at least an electronic component having a highest mounting height is mounted, in a direction from the first surface toward the second surface; and sealing the first surface with resin.

In the manufacturing method of the present invention, in the step of forming the concave part, the concave part may be formed by injection molding.

In the step forming the concave part, the concave part may be formed by pressure of the resin that seals the first surface.

Effect of the Invention

In a component built-in module, an electronic device that includes it, and a method for manufacturing a component built-in module of the present invention, the component built-in module is formed by mounting at least the electronic component having the highest mounting height in the concave part of the flexible substrate, and sealing the first surface (mounting surface) of the flexible substrate with resin. Therefore, it becomes possible to reduce the mounted height of the electronic component (lower the position of the upper surface). From this reason, it becomes possible to reduce the thickness of the resin (resin layer) even if the surface is made flat, and it becomes possible to realize a further thinning of the component built-in module and by extension an electronic device that includes it.

Also, in an exemplary embodiment of the present invention, the resin of this kind of component built-in module is made into at least a part of the casing of an electronic device, that is to say, a plurality of electronic components of the component built-in module are constituted so as to be embedded in the casing of an electronic device. With this constitution, it becomes possible to realize further thinning of the electronic device.

Also, the component built-in module is formed by mounting at least the electronic component with the highest mounting height in the concave part of the flexible substrate, and sealing the first surface of the flexible substrate with the resin. Thereby, it is possible to easily and at a low cost produce the component built-in module and by extension an electronic device that includes it, and so it is possible to favorably adopt it for an electronic device such as a mobile phone that requires mass production.

BRIEF DESCRIPTION OF THE DRAWINGS

FIG. 2B is a cross-sectional view for describing the setting of the standard height HS and the formation of the concave part in the component built-in module according to the first exemplary embodiment of the present invention.

FIG. 4A is a cross-sectional view for describing the setting of the standard height HS and the formation of the concave part in the component built-in module according to the first exemplary embodiment of the present invention.

EMBODIMENTS FOR CARRYING OUT THE INVENTION

[First Exemplary Embodiment]

Hereinbelow, a component built-in module according to a first exemplary embodiment of the present invention, an electronic device including it, and a method for manufacturing a component built-in module shall be described, referring to FIG. 1 to FIG. 10. The present exemplary embodiment relates to a component built-in module that is installed in an electronic device in which greater thinness is sought such as a mobile phone, an electronic device, and a method for manufacturing a component built-in module.

Figure 1:
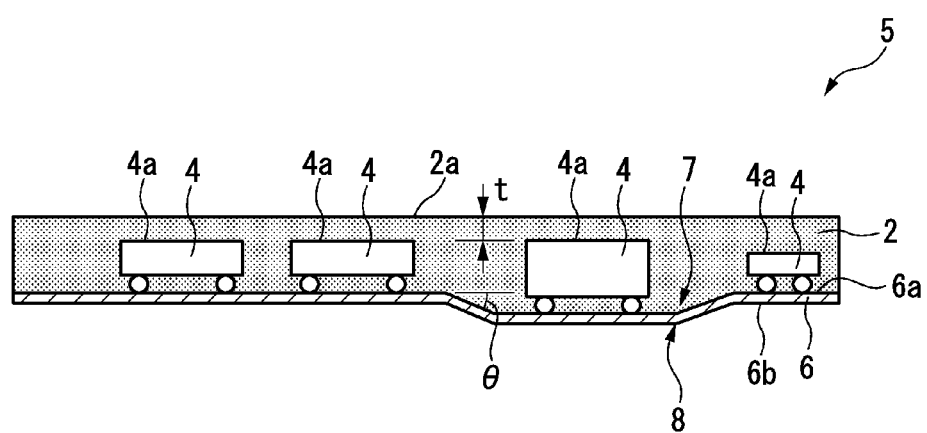
FIG. 1 is a cross-sectional view that shows a component built-in module according to a first exemplary embodiment of the present invention.

A component built-in module 5 of the present exemplary embodiment includes a flexible substrate 6 and a resin 2, as shown in FIG. 1. A plurality of electronic components 4 are mounted on the flexible substrate 6. The flexible substrate 6 has a first surface (mounting surface) 6a on which the electronic components 4 are mounted. The resin 2 seals the first surface 6a.

The plurality of electronic components 4 may be a memory chip, an LED, an RFID, a temperature sensor, an acceleration sensor, and the like. In this exemplary embodiment, a plurality of electronic components 4 having different mounting heights from the first surface 6a to the upper surfaces 4a of the components in the state of being mounted on the first surface 6a of the flexible substrate 6 are used. That is to say, a plurality of electronic components 4 having different thicknesses, such as for example 0.2 mm, 0.4 mm, 0.6 mm, and 0.8 mm are mounted on the flexible substrate 6.

The flexible substrate 6 of this exemplary embodiment may be a polyimide substrate with a thickness of for example 0.05 to 0.2 mm. The flexible substrate 6 has a second surface 6b (that is, a surface on the opposite side of the first surface 6a) that differs from the first surface 6a. A concave part 7 that is recessed in the direction of the second surface 6b (in the direction from the first surface 6a toward the second surface 6b) is formed in the first surface 6a.

The concave part 7 has a cross-sectional trapezoidal shape. The slope angle θ of the slope part of the concave part 7 is 60° or less with respect to the flat part of the first surface 6a (the part other than the concave part 7). For example, it is also possible to form the concave part 7 by bending back the flexible substrate 6 so that the slope angle θ is 90°. By making the slope angle θ 60° or less as in the present exemplary embodiment, it is possible to prevent breakage of the wiring of the flexible substrate 6.

In this exemplary embodiment, the concave part 7 is larger in size than the outer shape of the electronic component 4. For example, in the case of the size in plan view of the electronic component 4 being 5×5 mm, the size in plan view of the concave part 7 is 7×7 mm. In the present exemplary embodiment, the component built-in module 5 is formed by mounting at least the electronic component 4 with the largest mounting height in this concave part 7.

As the resin 2, acrylic, ABS, PC, epoxy resin, urethane resin, silicon resin, or the like is used according to the object. In this exemplary embodiment, the entire surface of the first surface 6a is sealed by the resin 2. As for the resin layer 2 of this exemplary embodiment, a surface 2a is formed flatly. In addition, it is formed so that the distance t between the upper surface 4a of the electronic component 4 with the shortest distance from the surface 2a of the resin 2 to the upper surface 4a of the electronic component 4 and the surface 2a of the resin 2 becomes 0.2 mm or more. In the case of a light emitting device such as an LED being mounted as the electronic component 4, it is desirable to use a transparent resin 2 from the standpoint of light transmittance.

The component built-in module 5 is formed by forming the concave part 7 in the flexible substrate 6 as mentioned above, and then housing at least the electronic component 4 with the largest mounting height in this concave part 7. A description shall be given using as an example a circuit that is configured by an LED with a thickness of 0.4 mm, a control LSI with a thickness of 0.8 mm, and a chip resistor with a thickness of 0.3 mm. In the case of this circuit, the height of the upper surface of the control LSI is matched to the height of the upper surface of the LED. For this reason, the concave part 7 (convex part 8 on the reverse surface side) is formed so that the electronic component 4 is projected out by 0.4 mm to the second surface 6b side at the part of the flexible substrate 6 where the control LSI is to be mounted.

Figure 2A:
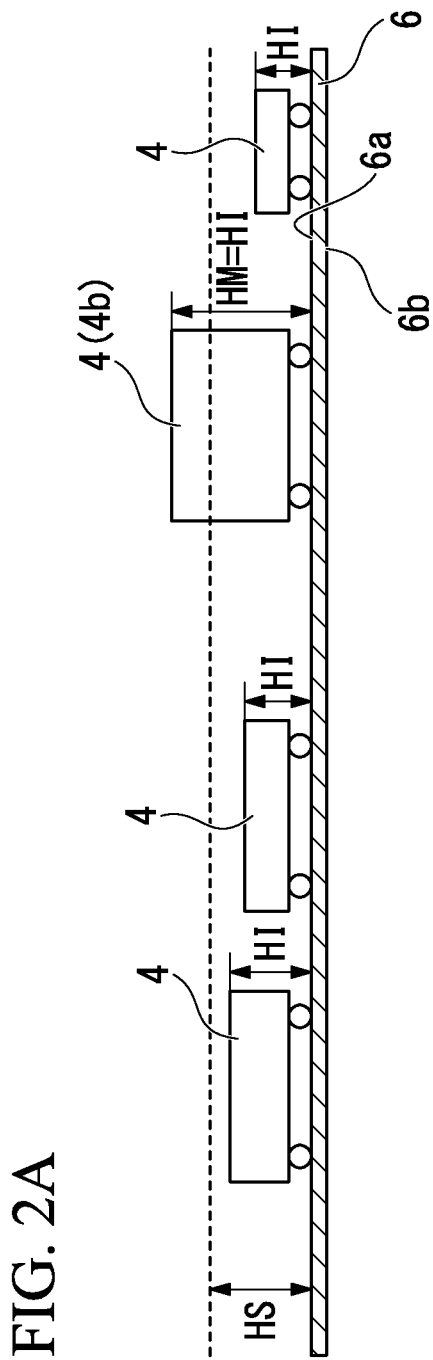
FIG. 2A is a cross-sectional view for describing the setting of a standard height HS and formation of a concave part in the component built-in module according to the first exemplary embodiment of the present invention.

In FIG. 2A and FIG. 2B, the respective heights of the plurality of electronic components 4 are shown as HI, the mounting height of the electronic component 4 with the largest mounting height is shown as HM, the standard height from the flat part of the first surface 6a of the flexible substrate 6 is shown as HS, and the heights of all the electronic components 4 from the flat part of the first surface 6a are shown as HF. In the component built-in module 5 of the present exemplary embodiment, as shown in FIG. 2A, the standard height HS is set so that the relation HM>HS is true. As shown in FIG. 2A and FIG. 2B, the concave part 7 is formed so that the relation HF≤HS is true. The component built-in module 5 of the present exemplary embodiment is formed by mounting the electronic component 4 (4b) having a mounting height HI such that the relation HI>HS is true, and then sealing the first surface 6a of the flexible substrate 6 with the resin 2.

By forming the concave part 7 of the flexible substrate 6 in this way and then forming the resin layer 2, compared to previously, it is possible to make the resin layer 2 thinner (the thickness from the flat part of the flexible substrate 6 to the surface 2a of the resin 2). Thereby, it is possible to make the component built-in module 5 thinner while making the surface (the surface 2a of the resin layer 2) into a shape conforming to the casing of an electronic device (flat).

Figure 3A:
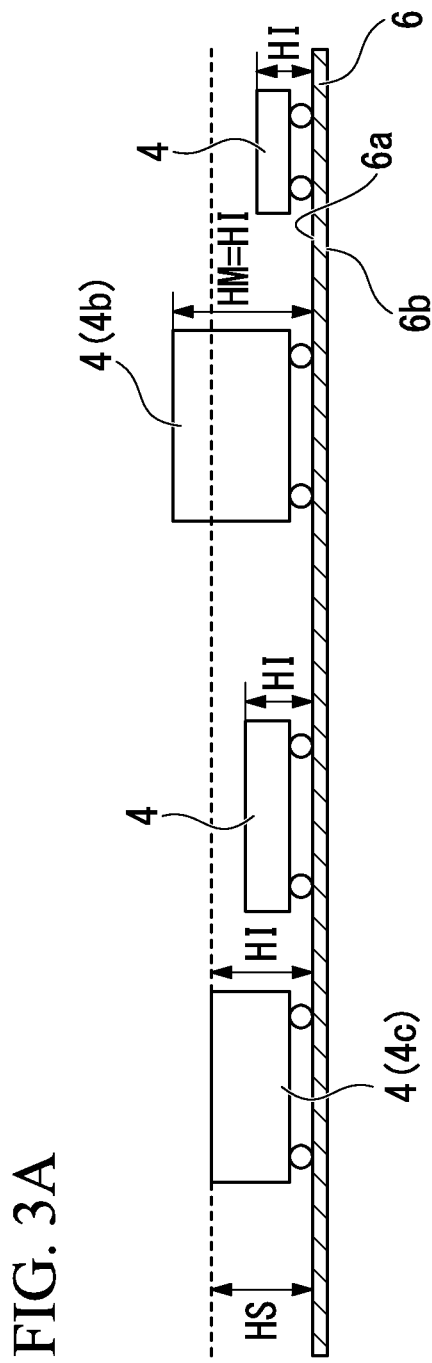
FIG. 3A is a cross-sectional view for describing the setting of the standard height HS and the formation of the concave part in the component built-in module according to the first exemplary embodiment of the present invention.
Figure 3B:
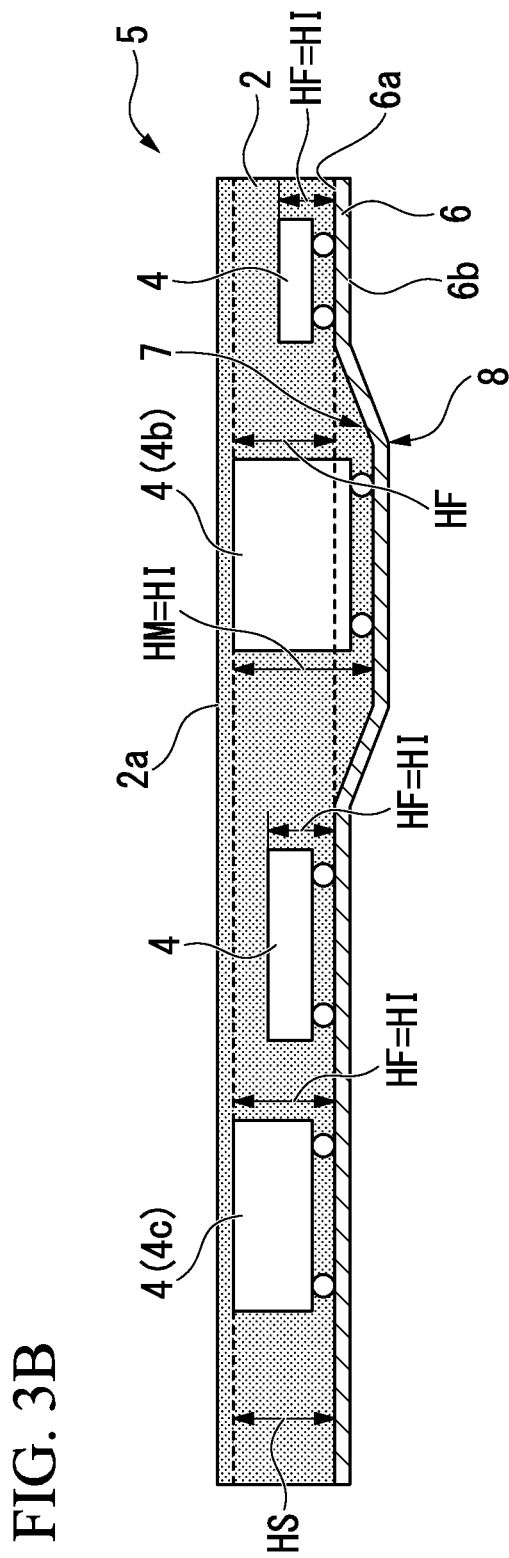
FIG. 3B is a cross-sectional view for describing the setting of the standard height HS and the formation of the concave part in the component built-in module according to the first exemplary embodiment of the present invention.

At this time, as shown in FIG. 3A, the standard height HS may be set so as to be the same height as the mounting height of the electronic component 4 (4c) that has the second highest mounting height, among the plurality of the electronic components 4. In this case, as shown in FIG. 3B, by mounting the electronic component 4 (4b) that has the mounting height HI in which the relation HI>HS is true in the concave part 7, the relation HF≤HS is true for all the electronic components 4. Thereby, compared to previously, it is possible to make the resin layer 2 thinner. Thereby, it is possible to make the component built-in module 5 thinner while making the surface 2a into a shape conforming to the casing of an electronic device.

Figure 4B:
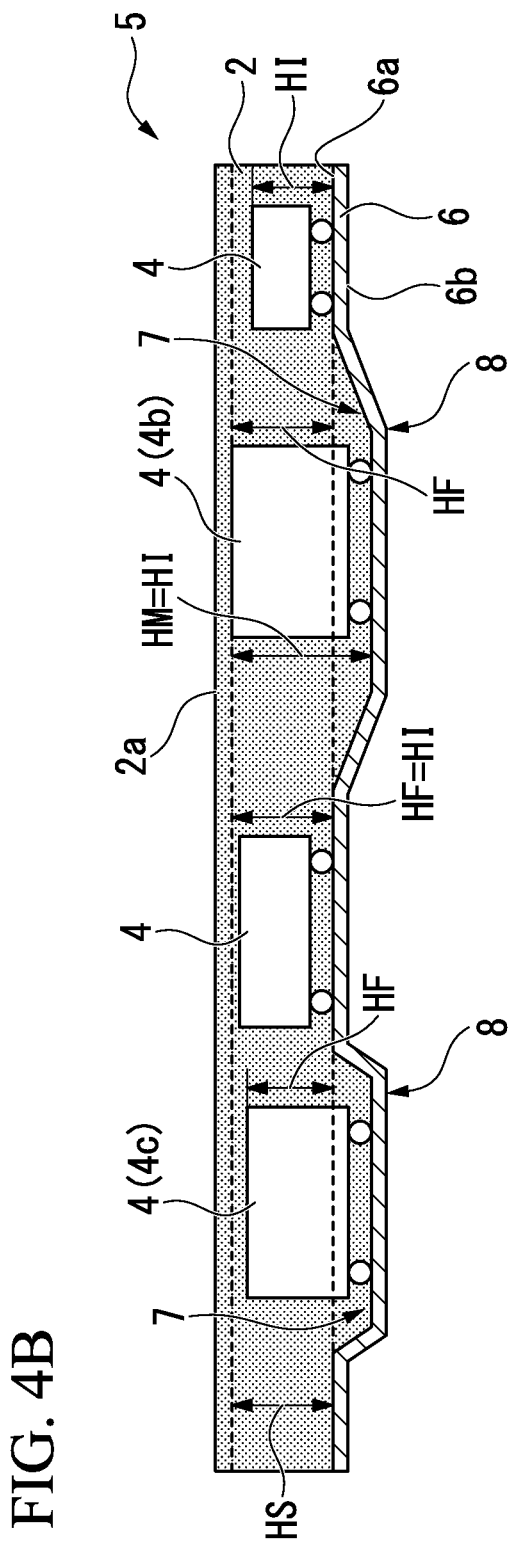
FIG. 4B is a cross-sectional view for describing the setting of the standard height HS and the formation of the concave part in the component built-in module according to the first exemplary embodiment of the present invention.

As shown in FIG. 4A, the standard height HS may be set so as to be the same height as the average value of the mounting heights of the plurality of electronic components 4. Even in this case, as shown in FIG. 4B, by mounting the electronic components 4 (4b, 4c) that have mounting heights HI in which the relation of HI>HS is true in concave parts 7, the relation of HF≤HS holds true for all of the electronic components 4. Thereby, compared to previously, it is possible to make the resin layer 2 thinner. Thereby, it is possible to reliably make the component built-in module 5 thinner while making the surface 2a into a shape conforming to the casing of an electronic device.

Figure 5:
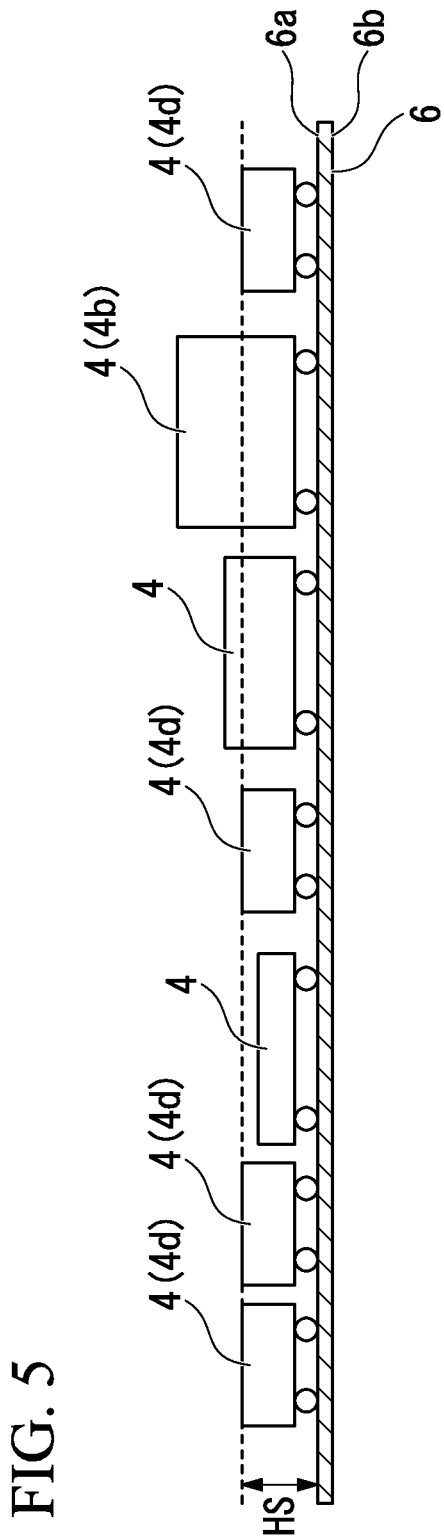
FIG. 5 is a cross-sectional view for describing the setting of the standard height HS and the formation of the concave part in the component built-in module according to the first exemplary embodiment of the present invention.

As shown in FIG. 5, the standard height HS may be set so as to be the same height as the mounting height of the electronic components 4 (4d) having the same mounting height whose number mounted on the first surface 6a is the most numerous, among the plurality of electronic components 4. Even in the case of setting the standard height HS in this manner, it is possible to make the resin layer 2 thinner. Thereby, it is possible to reliably make the component built-in module 5 thinner while making the surface 2a into a shape conforming to the casing of an electronic device.

Figure 6:
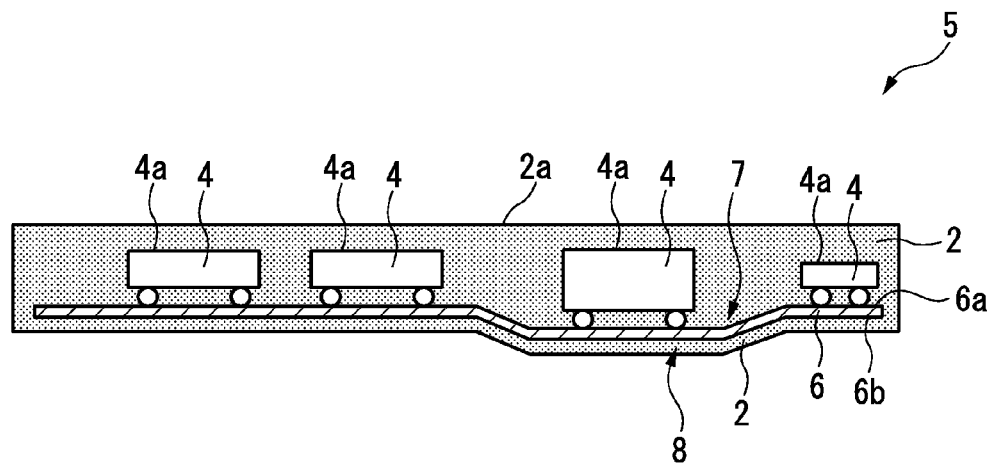
FIG. 6 is a cross-sectional view that shows a modification of the component built-in module according to the first exemplary embodiment of the present invention.

The component built-in module 5 of the exemplary embodiment of the present invention may be formed by sealing both surfaces 6a and 6b of the flexible substrate 6 with the resin 2, as shown in FIG. 6. At this time, when constituting the end part of the flexible substrate 6 so as to be covered by the upper resin layer 2 that seals the first surface 6a and the lower resin layer 2 that seals the second surface 6b, it is possible to inhibit exfoliation of the flexible substrate 6 and each resin layer 2. Also, in this case, the resin 2 that seals the second surface 6b side of the flexible substrate 6 (the reverse side of the electronic component mounting surface) need not cover the entire surface, provided it is formed at least at the end part.

Also, it is desirable that the thickness of the resin layer 2 that seals the second surface 6b of the flexible substrate 6 be 0.1 to 0.5 mm.

Figure 7:
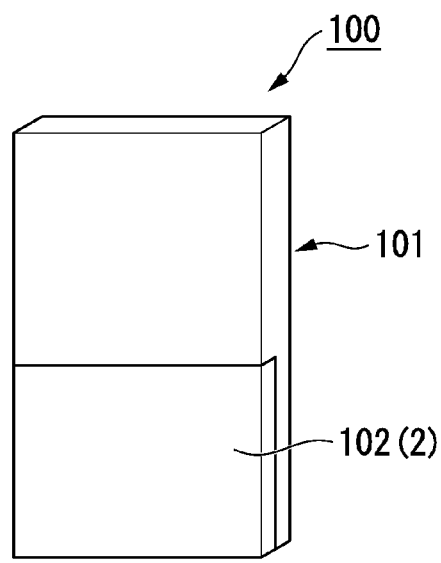
FIG. 7 is a perspective that shows a mobile phone that includes the component built-in module according to the first exemplary embodiment of the present invention.

An electronic device of the present exemplary embodiment that includes the aforementioned component built-in module 5 is for example a mobile phone or the like. This electronic device is constituted from a casing that includes an upper casing and a lower casing, and the component built-in module 5 that includes a plurality of electronic components 4 that are built into the interior of that casing. Also, the electronic device of the present exemplary embodiment is constituted by embedding the aforementioned component built-in module 5 in a part of the battery cover of the electronic device or the casing surface. By constituting it in this way, it is possible to cut down the space in the casing of the electronic device and realize a reduction in thickness. Moreover, in the case of constituting it in this way, by replacing the component built-in module 5, it is possible to easily change a function of the electronic device. FIG. 7 shows a casing 101 of a mobile phone 100 of the present exemplary embodiment. A battery cover 102 that is a part of this casing is constituted by the resin 2 of the component built-in module 5.

In the component built-in module 5, in accordance with the thickness of the electronic components 4 that are mounted on the flexible substrate 6, the concave part 7 is formed in the first surface 6a and the convex part 8 is formed in the second surface 6b. For this reason, the electronic device is formed by adjusting the mounting positions of the battery and the electronic components 4 of the component built-in module 5 in the casing are adjusted so that the convex part 8 of the component built-in module 5 and the other modules with a built-in components and the battery that are installed in the casing do not interfere.

Next, a method for manufacturing the component built-in module 5 of the present exemplary embodiment having the aforementioned constitutions shall be described.

Figure 8A:
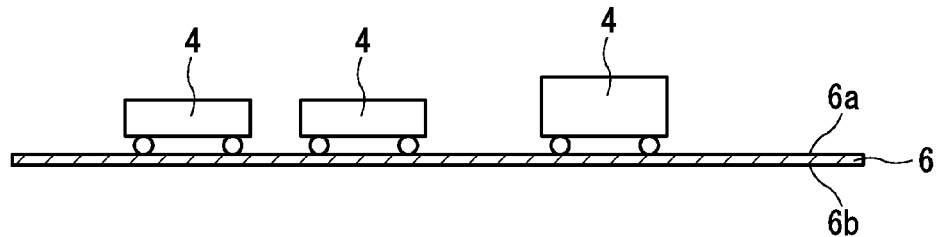
FIG. 8A is a cross-sectional view that shows a method of manufacturing a component built-in module according to the first exemplary embodiment of the present invention.
Figure 8B:
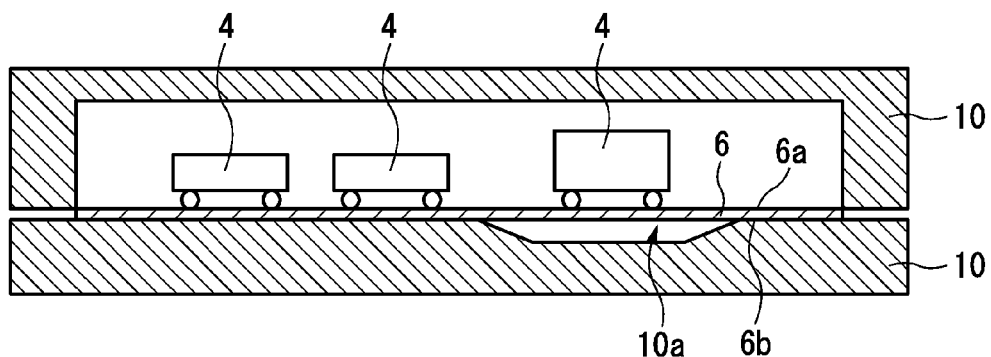
FIG. 8B is a cross-sectional view that shows the method of manufacturing a component built-in module according to the first exemplary embodiment of the present invention.
Figure 9:
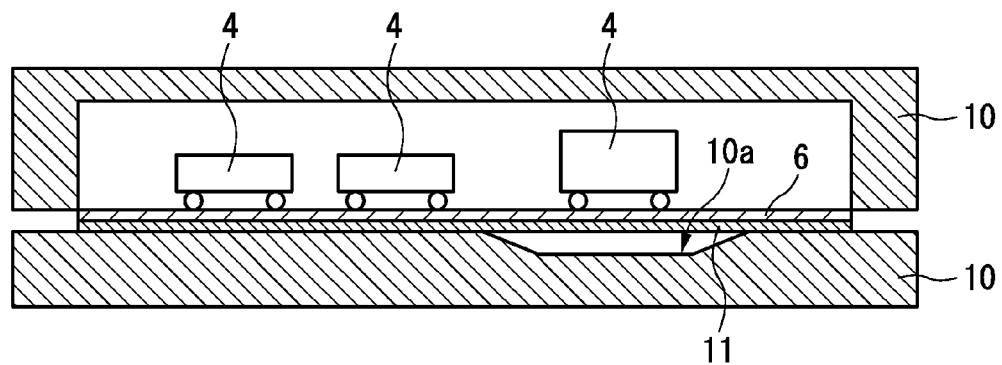
FIG. 9 is a cross-sectional view that shows a modification of the method of manufacturing a component built-in module according to the first exemplary embodiment of the present invention.

When manufacturing the component built-in module 5 of the present exemplary embodiment, as shown in FIG. 8A, first, the plurality of electronic components 4 are mounted on the first surface 6a of the flexible substrate 6 with a planar shape (electronic component mounting step). Next, as shown in FIG. 8B, the flexible substrate 6 in the state of the electronic components 4 mounted thereon is placed on a mold 10 in order to seal the flexible substrate 6 with the resin 2. At this time, in the case of sealing the second surface 6b side of the flexible substrate 6 with the resin 2, as shown in FIG. 9, a resin sheet 11 is interposed in advance between the mold 10 and the flexible substrate 6. The thickness of the resin sheet 11 is preferably 0.1 to 0.5 mm.

In the case of using a thermoplastic resin such as acrylic, ABS, and PC as the resin 2 that seals the flexible substrate 6, the temperature of the mold 10 is made to be around 80° C. As shown in FIG. 8B, a trench 10a is formed in the mold 10 in accordance with the thickness of the electronic component 4 (in accordance with the size of the concave part 7) at a location corresponding to the thick electronic component 4, that is to say, the location for forming the concave part 7 in the flexible substrate 6. For example, when manufacturing the component built-in module 5 in which the thickness of the electronic component 4 is 0.8 mm and having a structure that projects out 0.4 mm to the second surface 6b side of the flexible substrate 6, the trench 10a with a depth of 0.4 mm is formed in the mold 10. In the present exemplary embodiment, the shape of the trench 10a is made to have a tapered structure (cross-sectional trapezoidal shape).

Figure 8C:
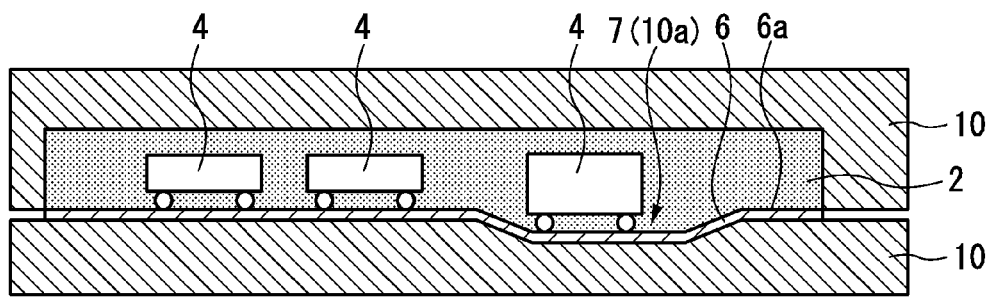
FIG. 8C is a cross-sectional view that shows the method of manufacturing a component built-in module according to the first exemplary embodiment of the present invention.

Next, in the present exemplary embodiment, as shown in FIG. 8C, the mold 10 is clamped, and the resin 2 is injected into the mold 10. At this time, the flexible substrate 6 deforms along the inner surface of the mold 10 due to the injection pressure of the resin 2. For this reason, the flexible substrate 6 deforms according to the shape of the trench 10a of the mold 10 due to the pressure of the resin 2, and the concave part 7 is formed. Also, the electronic component 4 is accommodated in the concave part 7 along with this. Thereby, the first surface 6a of the flexible substrate 6 is sealed by the resin 2 (concave part formation step, resin sealing step). That is to say, in the present exemplary embodiment, it is possible to perform the concave part formation step and the resin sealing step all at once (in one step).

Figure 8D:
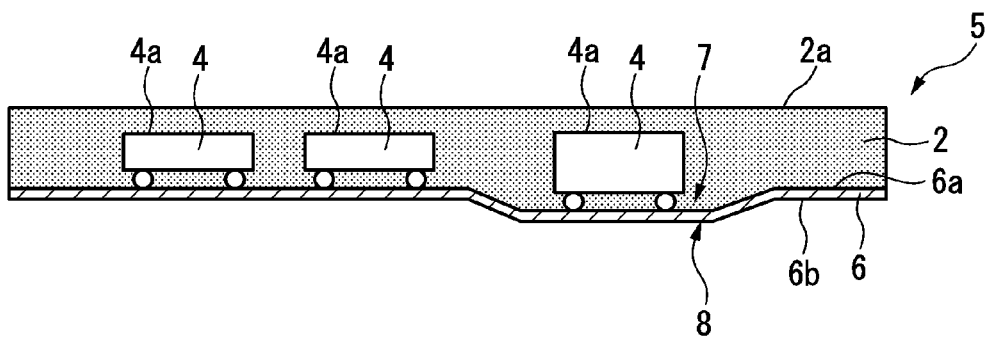
FIG. 8D is a cross-sectional view that shows the method of manufacturing a component built-in module according to the first exemplary embodiment of the present invention.

As shown in FIG. 8D, by removing the flexible substrate 6 that has been resin sealed from the mold 10, the component built-in module 5 of the present exemplary embodiment is completed.

Figure 10:
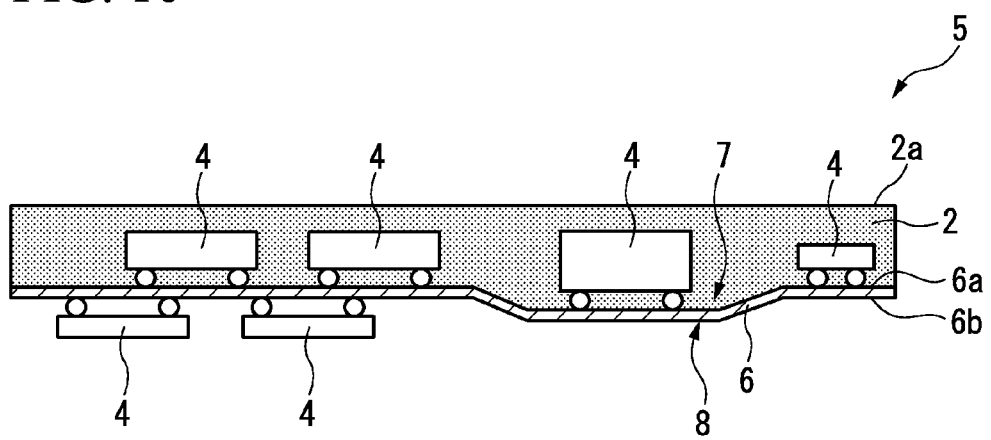
FIG. 10 is a view that shows a modification of the component built-in module according to the first exemplary embodiment of the present invention, being a cross-sectional view that shows a component built-in module in which electronic components are mounted on a first surface and a second surface of the flexible substrate.

As shown in FIG. 10, the component built-in module 5 of the exemplary embodiment of the present invention may be formed by mounting electronic components 4 on the second surface 6b side of the flexible substrate 6, and in the case of mounting electronic components 4 on the second surface 6b side in this say, it is possible to mount the electronic components 4 on the second surface 6b side at the stage of having removed the resin-sealed flexible substrate 6 from the mold 10. Also, in the case of enhancing the design, at the stage of having removed the resin-sealed flexible substrate 6 from the mold 10, it is possible to form a decorating sheet or coating film. Also, an electronic component 4 may also be formed on an inclined surface of the concave part 7 of the flexible substrate 6.

As described above, an injection-molding method has been illustrated as the resin sealing method, but it is possible to select a method in accordance with the resin 2 to be used. For example, in the case of having selected a thermoplastic resin, resin sealing by the injection-molding method may be performed, while in the case of having selected a thermosetting resin, resin sealing by the transfer mold method may be performed.

The concave part formation step and the resin sealing step need not necessarily be performed all at once as described above. That is to say, the concave part 7 may be formed by press working the flexible substrate 6, and in the case of using a flexible substrate 6 having thickness, the concave part 7 may be formed by laser working or the like. The component built-in module 5 may be manufactured by mounting the electronic component 4 on the flexible substrate 6 in which the concave part 7 is formed in advance in this way, and performing resin sealing.

Therefore, according to the component built-in module 5 of the present exemplary embodiment, an electronic device that includes it, and the method for manufacturing the component built-in module 5, the component built-in module 5 is formed by mounting at least the electronic component 4 with the largest mounting height in the concave part 7 of the flexible substrate 6, and sealing the first surface (mounting surface) 6a of the flexible substrate 6 with the resin 2. For this reason, it becomes possible to lower the mounting height of the electronic component 4 (lower the position of the upper surface 4a). Thereby, it becomes possible to reduce the thickness of the resin (resin layer) 2 even if the surface 2a is made flat, and it is possible to realize a further thinning of the component built-in module 5 and by extension an electronic device that includes it.

Also, by forming the resin 2 of this kind of component built-in module 5 into at least a part of a casing of an electronic device, that is, by constituting a plurality of electronic components 4 of the component built-in module 5 so as to be embedded in the casing of an electronic device, it becomes possible to realize further thinning of the electronic device.

Moreover, the component built-in module 5 is formed by mounting at least the electronic component 4 with the largest mounting height in the concave part 7 of the flexible substrate 6, and sealing the first surface 6a of the flexible substrate 6 with the resin 2. Thereby, it is possible to easily and at a low cost produce the component built-in module 5 and by extension an electronic device that includes it, and so it is possible to favorably adopt it for an electronic device such as a mobile phone that requires mass production.

Also, in the component built-in module 5 of the present exemplary embodiment, the mounting height of the electronic component 2 with the largest mounting height is denoted as HM, the standard height from the flat part of the first surface 6a is denoted as HS, the respective heights of the plurality of electronic components 4 are denoted as HI, and the heights of all the electronic components 4 from the flat part of the first surface 6a are denoted as HF. The standard height HS is set so that the relation HM>HS is true. At this time, the standard height HS is set so that the relation HM>HS is true, the concave part 7 is formed so that the relation HF≤HS is true, and an electronic component 4 having the mounting height HI in which the relation HI>HS is true is mounted in the concave part 7. Also, the first surface 6a is sealed by the resin 2. Thereby, compared to previously, it is possible to make the resin layer 2 thinner. Thereby, it is possible to reduce the thickness of the component built-in module 5 while making the surface into a shape that conforms to the casing of the electronic device (flat).

At this time, the standard height HS may be set in the following manner. That is to say, the standard height HS may be set so as to be the same height as the mounting height of the electronic component 4 that has the second highest mounting height, among the plurality of the electronic components 4. Alternatively, the standard height HS may be set so as to be the same height as the average value of the mounting heights of the plurality of electronic components 4. Alternatively, the standard height HS may be set so as to be the same height as the mounting height of the electronic components 4 having the same mounting height whose number mounted on the first surface 6a is the most numerous, among the plurality of electronic components 4. With this constitution, it is possible to make the resin layer 2 thinner. Thereby, it is possible to reliably make the component built-in module 5 thinner while making the surface 2a into a shape conforming to the casing of an electronic device (flat).

In the component built-in module 5 of the present exemplary embodiment, the entirety of the first surface 6a of the flexible substrate 6 is sealed with the resin 2. With this constitution, it is possible to form the component built-in module 5 to have excellent durability and high reliability. Also, it is possible to reliably and favorably use the resin 2 as a part of a casing of an electronic device.

The distance between the upper surface 4a of the electronic component 4 with the shortest distance from the surface 2a of the resin 2 to the upper surface 4a of the electronic component 4 and the surface 2a of the resin 2 is 0.2 mm or more. With this constitution, it is possible to make the surface 2a of the resin 2 into a shape that conforms to the casing of the electronic device (flat). In addition, it is possible to form the component built-in module 5 to have excellent durability and high reliability.

The concave part 7 of the flexible substrate 6 is a cross-sectional trapezoidal shape that has an inclined part. The inclination angle θ of the inclined part is 60° or less with respect to the flat part of the first surface 6a. By this constitution, it is possible to prevent breakage of the wiring of the flexible substrate 6.

In the method for manufacturing the component built-in module 5 of the present exemplary embodiment, by forming the concave part 7 of the flexible substrate 6 by injection molding, and moreover by forming the concave part 7 by the pressure of the resin 2 that seals the first surface 6a, it is possible to perform the concave part formation step and the resin sealing step all at once (in one step). Thereby, with certainty it is possible to easily and at a low cost mass produce (manufacture) the component built-in module 5 and by extension an electronic device that includes it.

Hereinabove, the first exemplary embodiment of a component built-in module, an electronic device that includes it, and a method for manufacturing a component built-in module according to the present invention has been described, but the present invention is not limited to the aforementioned exemplary embodiment, and it is possible to make suitable modifications within a range that does not depart from the scope thereof.

Figure 11A:
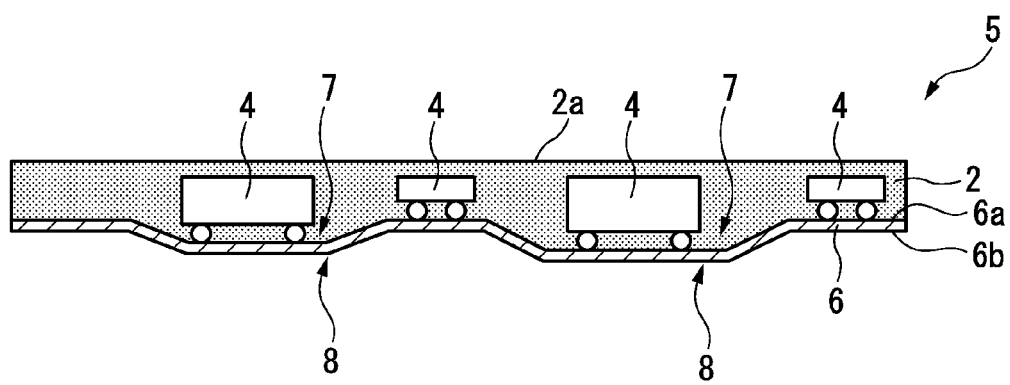
FIG. 11A is a view that shows a modification of the component built-in module according to the first exemplary embodiment of the present invention, being a cross-sectional view that shows a component built-in module including a flexible substrate in which a plurality of concave parts are formed.
Figure 11B:
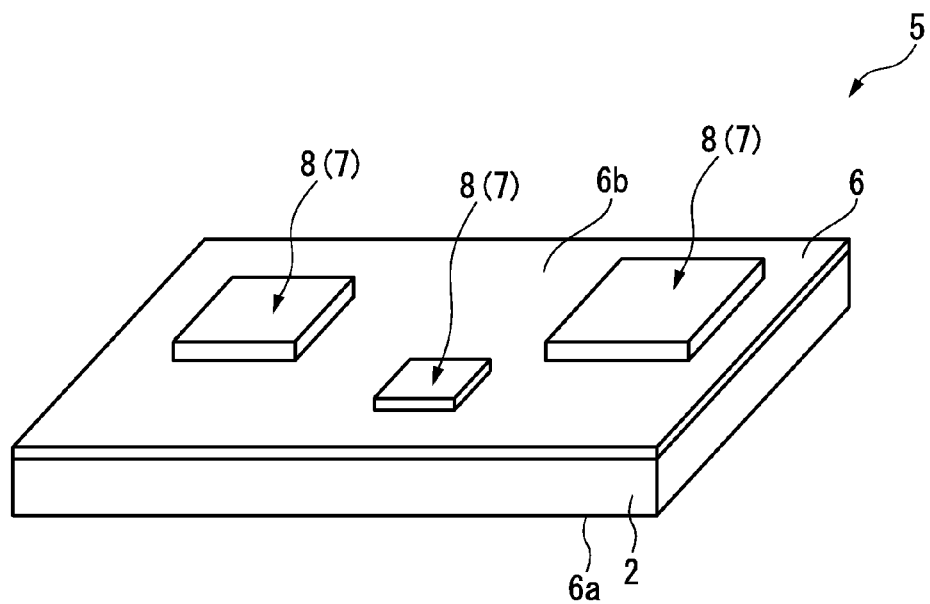
FIG. 11B is a view that shows a modification of the component built-in module according to the first exemplary embodiment of the present invention, being a cross-sectional view that shows a component built-in module including a flexible substrate in which a plurality of concave parts are formed.

For example, as shown in FIG. 11A and FIG. 11B, a plurality of concave parts 7 of differing depths (convex parts 8 of differing heights) may formed in the flexible substrate 6. In this case, for example the concave parts 7 are formed so as to bring the heights of the upper surface 4a of the electronic component 4 with the greatest thickness of 0.8 mm and the electronic component 4 with a thickness of 0.6 mm into alignment with the electronic components 4 with a thickness of 0.4 mm. That is to say, the flexible substrate 6 at the location where the electronic component 4 with a thickness of 0.6 mm is mounted projects out by 0.2 mm to the second surface 6b side, and the flexible substrate 6 at the location where the electronic component 4 with a thickness of 0.8 mm is mounted projects out by 0.4 mm to the second surface 6b side. Thereby, it is possible to bring the height of the upper surface 4a of the thickest electronic component 4 into alignment with 0.4 mm. Also, it is also possible to bring all of the plurality of electronic components 4 into alignment with electronic components 4 having a thickness of 0.2 mm.

Figure 12:
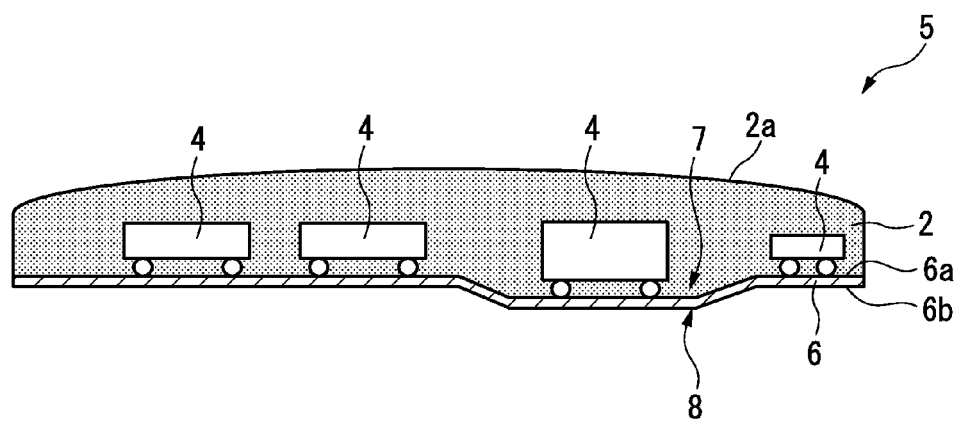
FIG. 12 is a view that shows a modification of the component built-in module according to the first exemplary embodiment of the present invention, being a cross-sectional view that shows a component built-in module in which a surface of a resin layer is formed in a curved shape.

The surface (resin surface) 2a of the resin 2 need not be flat, and it can be freely changed depending on the design of the electronic device that incorporates the component built-in module 5. For example, it is possible to make it into a curved shape as shown for example in FIG. 12. Moreover, the flexible substrate 6 may also be formed in a curved shape (that is to say, the flexible substrate 6 may include a curved surface).

Figure 13:
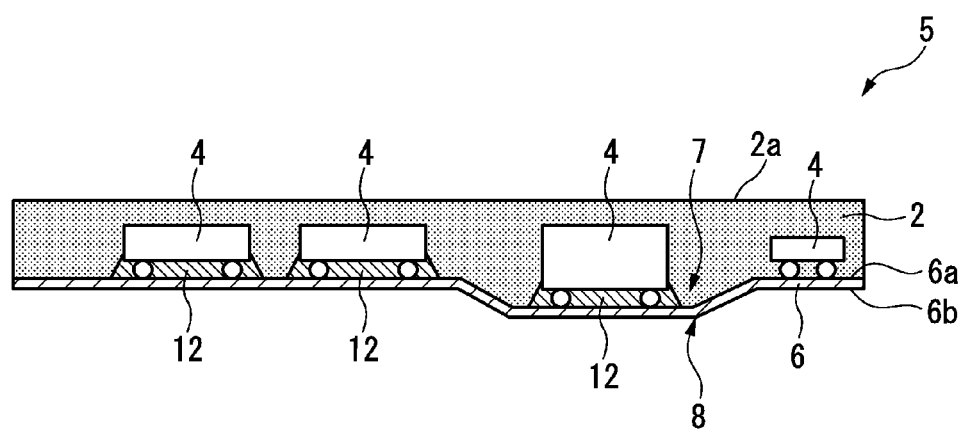
FIG. 13 is a view that shows a modification of the component built-in module according to the first exemplary embodiment of the present invention, being a cross-sectional view that shows a component built-in module that includes underfill resins.

As shown in FIG. 13 an underfill resin 12 for soldered joint reinforcement may be formed at the electronic components 4.

Figure 14:
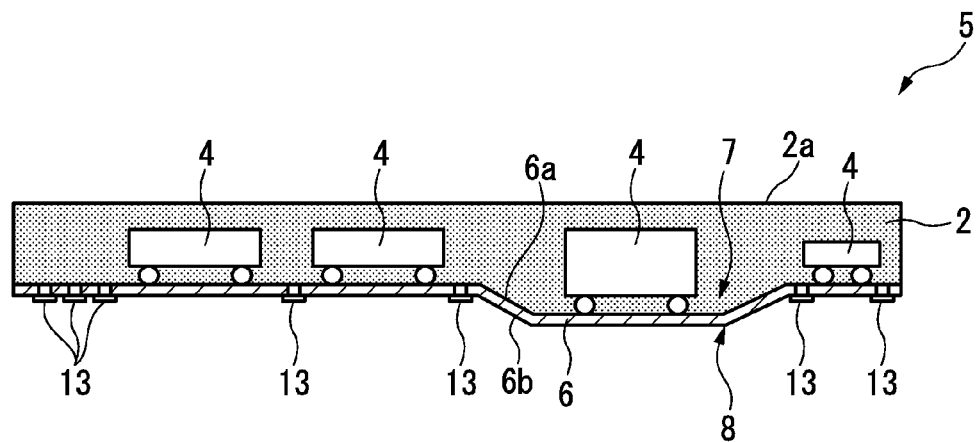
FIG. 14 is a view that shows a modification of the component built-in module according to the first exemplary embodiment of the present invention, being a cross-sectional view that shows a component built-in module that includes a flexible substrate in which hole parts are formed.

As shown in FIG. 14, in the component built-in module 5, the flexible substrate 6 may include hole parts 13 that penetrate from the first surface 6a to the second surface 6b. In this case, for example circular hole parts 13 are formed in advance in the flexible substrate 6. With this constitution, when sealing the flexible substrate 6 with the resin 2, the resin 2 is filled in the hole parts 13, and it is possible to inhibit exfoliation of the flexible substrate 6 and the resin 2. In the case of forming hole parts 13 having a circular shape, it is preferable to make the diameters of the hole parts 13 around 0.1 to 2 mm.

Figure 15:
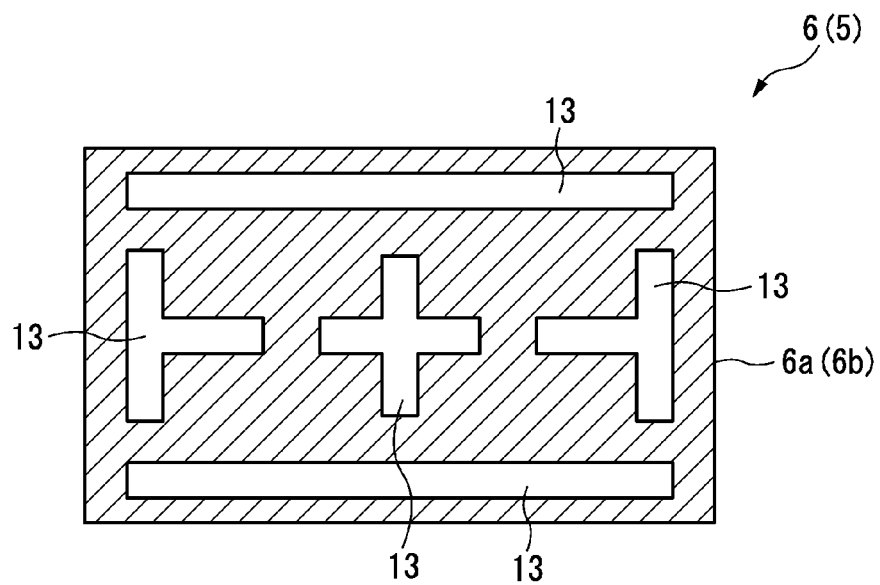
FIG. 15 is a plan view that shows a modification of the hole parts of the component built-in module according to the first exemplary embodiment of the present invention.

The hole parts 13 are not necessarily limited to a circular hole. The hole parts 13 as shown in FIG. 15 may be formed at regions extending over the entire surface of the flexible substrate 6. In the case of forming such hole parts 13, many regions are formed that are constituted solely by the resin 2. For this reason, it is possible to obtain an effect of inhibiting warpage of the component built-in module 5.

Figure 16:
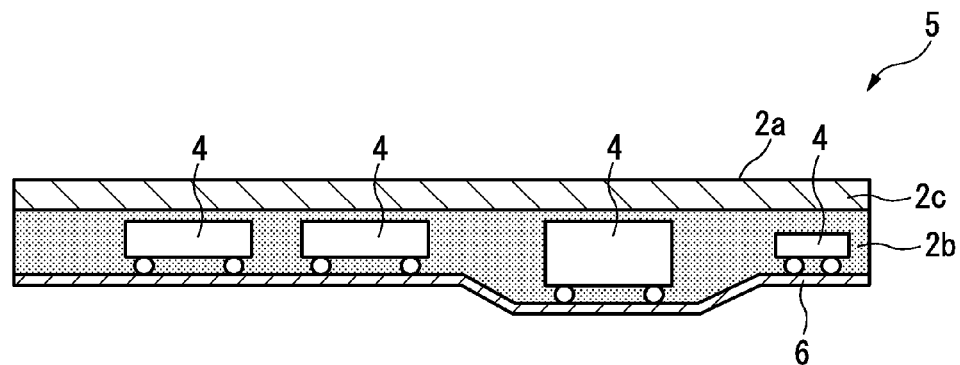
FIG. 16 is a view that shows a modification of the component built-in module according to the first exemplary embodiment of the present invention, being a cross-sectional view that shows a component built-in module that includes a resin layer having a two-layer structure.

As shown in FIG. 16, the resin 2 may be formed by a two-layer structure of a first resin layer 2b and a second resin layer 2c. The first resin layer 2b is disposed covering the electronic components 4 that are mounted on the flexible substrate 6. The second resin layer 2c is disposed by being laminated on the surface of the first resin layer 2b. In this case, it is preferable that the first resin layer 2b have a lower coefficient of linear expansion compared to the second resin layer 2c.

By making the resin 2 have a two-layer structure in this way, it is possible to reliably inhibit the occurrence of unevenness in the resin surface 2a caused by differences in the resin thickness between the locations where the electronic components 4 are mounted and the locations where they are not mounted. Also, in the case of a two-layer structure of the flexible substrate 6 and the resin 2, there is a risk of warpage due to the difference in the coefficients of linear expansion of both. On the other hand, by adopting a three-layer structure including the flexible substrate 6, the first resin layer (first resin) 2b, and the second resin layer (second resin) 2c, and matching the coefficient of linear expansion of the second resin layer 2c with the flexible substrate 6, it becomes possible to inhibit warpage.

The resin (resin layer) 2 according to the exemplary embodiment of the present invention is not limited to only being provided so as to seal the entire surface of the first surface 6a of the flexible substrate 6. The resin 2 may be provided so as to seal a part of the first surface 6a, or may be provided so as to seal the entire surface excluding the edge part of the first surface 6a.

Figure 17:
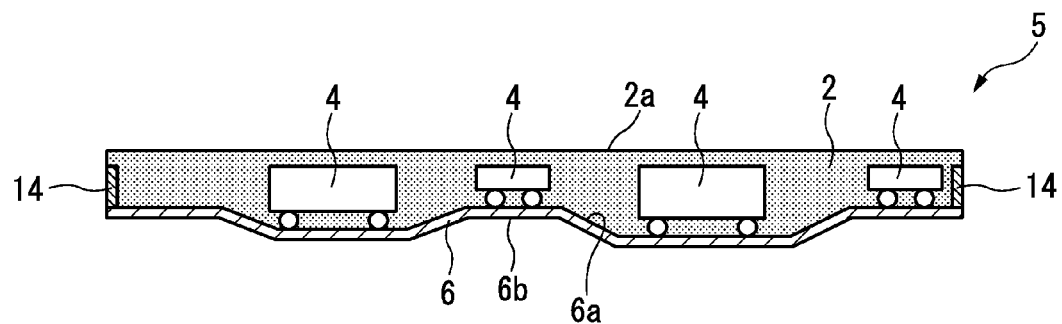
FIG. 17 is a view that shows a modification of the component built-in module according to the first exemplary embodiment of the present invention, being a cross-sectional view that shows a component built-in module that includes an exfoliation preventing member.

As shown in FIG. 17, the component built-in module 5 may include exfoliation preventing members 14. The exfoliation preventing member 14 is formed integrally by projecting upward from the first surface 6a at the edge of at least one side of the first surface 6a of the flexible substrate 6. By providing this kind of exfoliation preventing member 14, it is possible to reliably prevent exfoliation of the resin 2. Also, the electronic components 4 may be made to double as exfoliation preventing members 14.

[Second Exemplary Embodiment]

Figure 18A:
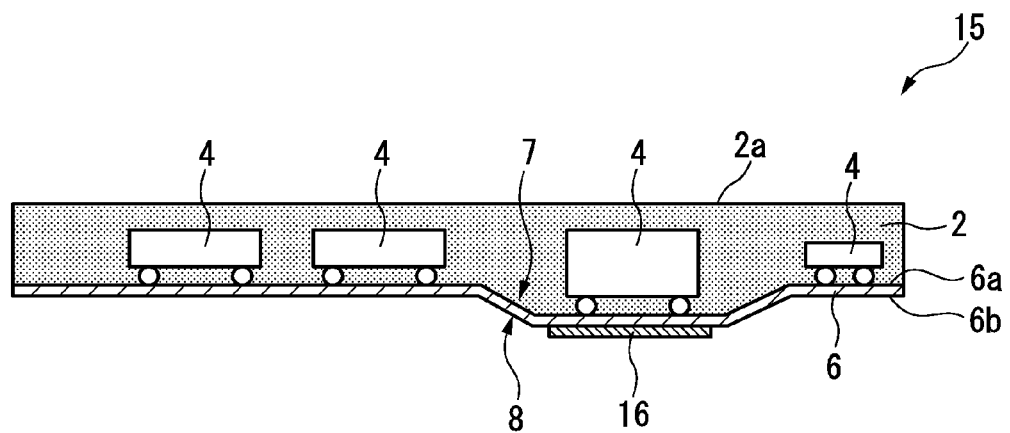
FIG. 18A is a view that shows a component built-in module according to a second exemplary embodiment of the present invention, being a cross-sectional view that shows a component built-in module that includes a reinforcing member.
Figure 18B:
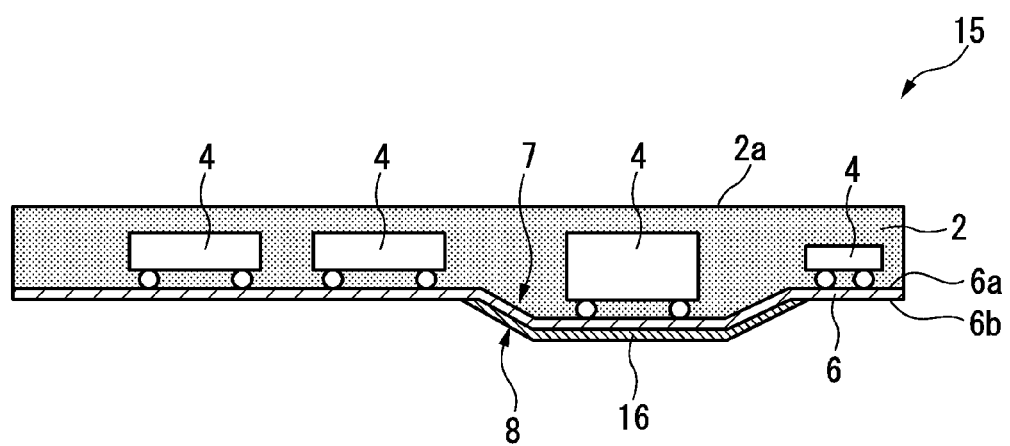
FIG. 18B is a view that shows the component built-in module according to the second exemplary embodiment of the present invention, being a cross-sectional view that shows a component built-in module that includes a reinforcing member.

Next, a component built-in module according to a second exemplary embodiment of the present invention, an electronic device that includes it, and a method for manufacturing a component built-in module shall be described referring to FIG. 18A and FIG. 18B. The second exemplary embodiment, similarly to the first exemplary embodiment, includes a flexible substrate 6 on which are mounted a plurality of electronic components 4, and a resin 2 that seals the flexible substrate 6. For this reason, in the second exemplary embodiment, constitutions that are similar as the first exemplary embodiment shall be denoted by the same reference symbols, with detailed descriptions thereof being omitted.

In a component built-in module 15 of the second exemplary embodiment, as shown in FIG. 18A and FIG. 18B, a concave part 7 is provided in the first surface 6a of the flexible substrate 6 similarly to the first exemplary embodiment. This concave part 7 is concave in the direction of the second surface 6b differing from the first surface 6a. At least the electronic component 4 having the largest mounting height is mounted in this concave part 7.

The component built-in module 15 of the present exemplary embodiment includes a reinforcing plate (reinforcing member) 16 in addition to the flexible substrate 6 and the resin 2 that seals the flexible substrate 6, as shown in FIG. 18A and FIG. 18B. This reinforcing plate 16 is mounted on the convex part 8 (or in the vicinity of the convex part 8) of the second surface 6b that is formed by the concave part 7 of the first surface 6a of the flexible substrate 6.

This reinforcing plate 16 is preferably a metallic material such as SUS. The thickness of the reinforcing plate 16 is preferably around 0.1 to 0.3 mm. This reinforcing plate 16 is integrally formed by being affixed to the convex part 8 with an adhesive.

By providing this kind of reinforcing plate 16, it is possible to prevent the electronic component 4 from being subjected to a load and damaged in the concave part formation step that forms the concave part 7 by deforming the flexible substrate 6 and accommodates an electronic component 4 that is mounted on the flexible substrate 6 in the concave part 7. Also, by providing the reinforcing plate 16, it is also possible to prevent breakage of the wiring of the flexible substrate 6.

Hereinabove, the component built-in module, the electronic device that includes, and a method for manufacturing a component built-in module according to the second exemplary embodiment of the present invention have been described. However, the present invention shall not be limited to the aforementioned exemplary embodiments and includes modifications of the first exemplary embodiment, and modifications may be suitably made without departing from the scope of the present invention.

Figure 19:
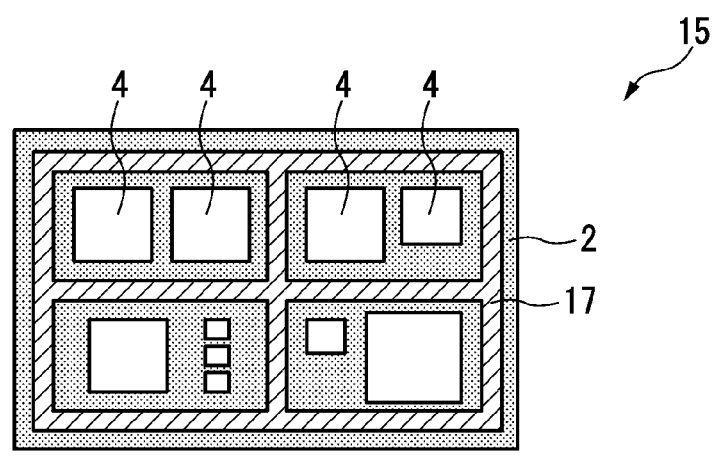
FIG. 19 is a plan view that shows a modification of the reinforcing member of the component built-in module according to the second exemplary embodiment of the present invention.
Figure 20A:
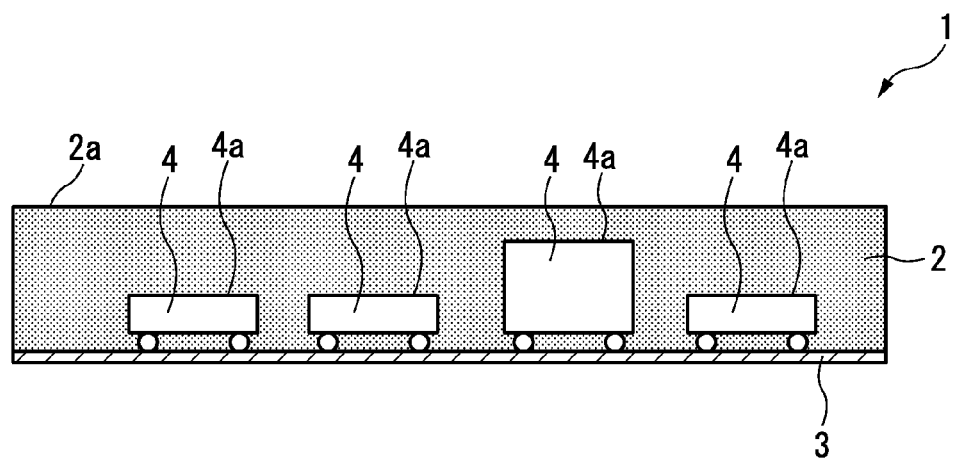
FIG. 20A is a cross-sectional view that shows a component built-in module according to related technology.
Figure 20B:
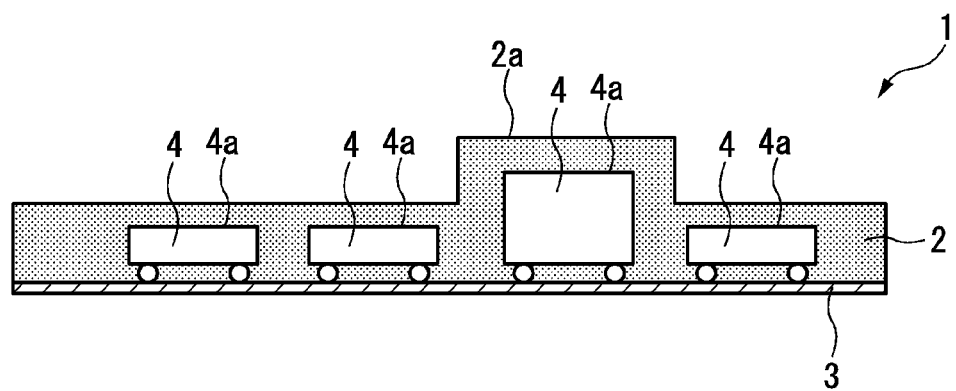
FIG. 20B is a cross-sectional view that shows a component built-in module according to related technology.

For example, the reinforcing member according to the exemplary embodiment of the present invention may be formed in a frame shape as shown in FIG. 19. By attaching this kind of reinforcing frame (reinforcing member) 17, it is also possible to inhibit warpage of the component built-in module 15.

This application is based upon and claims the benefit of priority from Japanese patent application No. 2010-232320, filed Oct. 15, 2010, the disclosure of which is incorporated herein in its entirety by reference.

INDUSTRIAL APPLICABILITY

The present invention can be applied to a component built-in module, an electronic device that includes it, and a method for manufacturing a component built-in module. According to the component built-in module, the electronic device that includes it, and the method for manufacturing a component built-in module, it is possible to realize a further reduction in thickness of a component built-in module, and by extension an electronic device that includes it.

REFERENCE SYMBOLS

1 Conventional component built-in module
2 Resin (resin layer)
2a Surface
2b First resin layer
2c Second resin layer
3 Wiring substrate
4 Electronic component
4a Upper surface
5 Component built-in module
6 Flexible substrate
6a First surface (mounting surface)
6b Second surface
7 Concave part
8 Convex part
10 Mold
10a Trench
11 Resin sheet
12 Underfill resin
13 Hole part 14 Exfoliation preventing member
15 Component built-in module
16 Reinforcing plate (reinforcing member)
17 Reinforcing frame (reinforcing member)
100 Mobile phone (electronic device)
101 Casing
102 Battery cover
θ Slope angle

What is claimed is:

1. A component built-in module comprising:
a flexible substrate that includes a first surface and a second surface on an opposite side of the first surface, the first surface including a concave part recessed in a direction from the first surface toward the second surface, the second surface including a convex part formed by the concave part;
a plurality of electronic components that are mounted on the first surface, mounting heights of the electronic components from the first surface to respective upper surfaces of the electronic components differing from each other;
a resin that seals the first surface;
a reinforcing member that is provided on or in a vicinity of the convex part; and
among the plurality of electronic components, at least an electronic component having a highest mounting height being mounted in the concave part.

2. The component built-in module according to claim 1, wherein the mounting height of the electronic component having the highest mounting height is HM, the mounting height of an electronic component having a second highest mounting height, among the plurality of the electronic components is HS, a set of the respective mounting heights of the plurality of electronic components is HI, and a set of heights of all of the plurality of electronic components from the flat part of the first surface of the respective upper surfaces of the electronic components is HF,
the concave part is formed so that a relation of at least one element of HF is less than or equal to HS is true, and
an electronic component having the mounting height of at least one element of HI, in which a relation of said at least one element of HI is greater than HS is true, is mounted in the concave part.

3. The component built-in module according to claim 1, wherein the mounting height of the electronic component having the highest mounting height is HM, an average value of the mounting heights of the plurality of the electronic components is HS, a set of the respective mounting heights of the plurality of electronic components is HI, and a set of heights of all of the plurality of electronic components from the flat part of the first surface to the respective upper surfaces of the electronic components is HF,
the concave part is formed so that a relation of at least one element of HF is less than or equal to HS is true, and
an electronic component having the mounting height of at least one element of HI, in which a relation of said at least one element of HI is greater than HS is true, is mounted in the concave part.

4. The component built-in module according to claim 1, wherein the mounting height of the electronic component having the highest mounting height is HM, the mounting height of electronic components having the same mounting height whose number mounted on the first surface is most numerous, among the plurality of electronic components is HS, a set of the respective mounting heights of the plurality of electronic components is HI, and a set of heights of all of the plurality of electronic components from the flat part of the first surface to the respective upper surfaces of the electronic components is HF,
the concave part is formed so that a relation of at least one element of HF is less than or equal to HS is true, and
an electronic component having the mounting height of at least one element of HI, in which a relation of said at least one element of HI is greater than HS is true, is mounted in the concave part.

5. The component built-in module according to claim 1, wherein an entire surface of the first surface is sealed with resin.

6. The component built-in module according to claim 1, wherein a distance between an upper surface of an electronic component having a shortest distance from a surface of the resin to the upper surface of the electronic component and the surface of the resin, is 0.2 mm or more.

7. The component built-in module according to claim 1, further comprising:
an exfoliation preventing member which prevents exfoliation of the resin provided at an edge of at least one side of the first surface.

8. The component built-in module according to claim 1, wherein the electronic component doubles as an exfoliation preventing member.

9. The component built-in module according to claim 1, wherein the flexible substrate further includes a hole part penetrating from the first surface to the second surface.

10. The component built-in module according to claim 1, wherein the concave part is a cross-sectional trapezoidal shape that has a slope part, and a slope angle of the slope part is 60° or less with respect to a flat part of the first surface.

11. The component built-in module according to claim 1, wherein the concave part is formed by injection molding.

12. The component built-in module according to claim 1, wherein the plurality of electronic components include an LED.

13. An electronic device comprising the component built-in module according to claim 1.

14. The electronic device according to claim 13, wherein the resin of the component built-in module constitutes at least a part of a casing of the electronic device.

15. A method for manufacturing a component built-in module comprising a flexible substrate that includes a first surface and a second surface on an opposite side of the first surface, the method comprising the steps of:
mounting a plurality of electronic components on the first surface;
forming a concave part, in a direction from the first surface toward the second surface, in which, among the plurality of electronic components, at least an electronic component having a highest mounting height is mounted;
forming a convex part on the second surface by forming the concave part;
providing a reinforcing member on or in a vicinity of the convex part; and
sealing the first surface with resin.

16. The manufacturing method according to claim 15, wherein in the step of forming the concave part, the concave part is formed by injection molding.

17. The manufacturing method according to claim 15 for a component built-in module, wherein in the step forming the concave part, the concave part is formed by pressure of the resin that seals the first surface.

* * * * *